(12) United States Patent
Lee et al.

(10) Patent No.: US 10,222,487 B2
(45) Date of Patent: Mar. 5, 2019

(54) X-RAY DETECTOR, X-RAY IMAGING DEVICE USING SAME, AND DRIVING METHOD THEREFOR

(71) Applicants: Rayence Co., Ltd., Gyeonggi-do (KR); VATECH EWOO Holdings Co., Ltd., Gyeonggi-do (KR); INDUSTRY-ACADEMIC COOPERATION FOUNDATION, YONSEI UNIVERSITY, Seoul (KR)

(72) Inventors: Dong Jin Lee, Gyeonggi-do (KR); Tae Woo Kim, Gyeonggi-do (KR); Seong Il Im, Seoul (KR); Pyo Jin Jeon, Seoul (KR)

(73) Assignees: Rayence Co., Ltd., Gyeonggi-do (KR); VATECH EWOO Holdings Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 255 days.

(21) Appl. No.: 15/101,522

(22) PCT Filed: Dec. 4, 2014

(86) PCT No.: PCT/KR2014/011816
§ 371 (c)(1),
(2) Date: Jun. 3, 2016

(87) PCT Pub. No.: WO2015/084068
PCT Pub. Date: Jun. 11, 2015

(65) Prior Publication Data
US 2016/0377744 A1    Dec. 29, 2016

(30) Foreign Application Priority Data
Dec. 4, 2013    (KR) .......................... 10-2013-0149934

(51) Int. Cl.
H05G 1/30    (2006.01)
G01T 1/24    (2006.01)
(Continued)

(52) U.S. Cl.
CPC ............. G01T 1/241 (2013.01); G01N 23/04 (2013.01); H01L 27/14676 (2013.01);
(Continued)

(58) Field of Classification Search
CPC ............ H05G 1/30; G01T 1/247; G01T 1/244; G01T 23/04
See application file for complete search history.

(56) References Cited

U.S. PATENT DOCUMENTS 4,886,962 A    12/1989    Gofuku et al.
5,136,389 A    8/1992    Suzuki et al.
(Continued)

FOREIGN PATENT DOCUMENTS

CN    102097521 A    6/2011
JP    10-056196 A    2/1998
(Continued)

OTHER PUBLICATIONS

European Patent Office, Extended European Search Report of corresponding EP Patent Application No. 14867936.8, dated Jul. 14, 2017.

*Primary Examiner* — Don Wong
(74) *Attorney, Agent, or Firm* — IP Legal Services, LLC

(57) ABSTRACT

The objective of the present invention is to effectively improve an image lag phenomenon of a direct conversion detector. The present invention provides an X-ray detector comprising: a lower electrode, formed on a substrate, to which a first driving voltage V1 is applied; an auxiliary electrode, around the lower electrode, to which a third driving voltage V3 is applied; a photoconductive layer
(Continued)

formed on the lower electrode and the auxiliary electrode; and an upper electrode, formed on the photoconductive layer, to which a second driving voltage V2 is applied, wherein the third driving voltage V3, right after the radiation of the X-rays is off, is a reverse bias voltage.

11 Claims, 3 Drawing Sheets

(51) Int. Cl.

| | |
|---|---|
| *H01L 31/08* | (2006.01) |
| *G01N 23/04* | (2018.01) |
| *H01L 27/146* | (2006.01) |
| *H01L 31/0224* | (2006.01) |
| *H01L 31/0272* | (2006.01) |
| *H01L 31/0296* | (2006.01) |
| *H01L 31/0304* | (2006.01) |
| *H01L 31/0328* | (2006.01) |

(52) U.S. Cl.
CPC ........ *H01L 31/0224* (2013.01); *H01L 31/085* (2013.01); *H01L 31/0272* (2013.01); *H01L 31/0296* (2013.01); *H01L 31/02966* (2013.01); *H01L 31/0304* (2013.01); *H01L 31/0328* (2013.01)

(56) References Cited

U.S. PATENT DOCUMENTS

| | | |
|---|---|---|
| 5,821,539 A | 10/1998 | Matz et al. |
| 6,423,974 B1 | 7/2002 | Ishikawa et al. |
| 7,211,803 B1 | 5/2007 | Dhurjaty et al. |
| 9,961,754 B2 * | 5/2018 | Kim ........................ H05G 1/30 |
| 2001/0035497 A1 | 11/2001 | Montemont et al. |
| 2002/0093581 A1 | 7/2002 | Ikeda et al. |
| 2006/0237647 A1 | 10/2006 | Ikeda et al. |
| 2010/0163740 A1 * | 7/2010 | Matsuura .......... H01L 31/02240 |
| | | 250/370.13 |
| 2013/0221241 A1 | 8/2013 | Rowlands et al. |

FOREIGN PATENT DOCUMENTS

| | | |
|---|---|---|
| JP | 2002-151669 A | 5/2002 |
| JP | 2004-134543 A | 4/2004 |
| WO | 2007/122890 A1 | 11/2007 |

* cited by examiner

X-RAY DETECTOR, X-RAY IMAGING DEVICE USING SAME, AND DRIVING METHOD THEREFOR

CROSS REFERENCE TO RELATED APPLICATIONS

This application is a National Stage Patent Application of PCT International Patent Application No. PCT/KR2014/011816 (filed on Dec. 4, 2014) under 35 U.S.C. § 371, which claims priority to Korean Patent Application No. 10-2013-0149934 (filed on Dec. 4, 2013), the teachings of which are incorporated herein in their entireties by reference.

TECHNICAL FIELD

The present invention relates to an X-ray detector and an X-ray imaging device using the same, and more particularly, to a direct X-ray detector capable of improving an image lag phenomenon, an X-ray imaging device using the direct X-ray detector, and a method for driving the X-ray imaging device.

BACKGROUND ART

Conventionally, in the photographing of X-rays for medicine and industry, a method using a film and a screen was used. In this case, it was inefficient in terms of cost and time due to problems in the development and storage of photographed films.

In order to improve the problem, a digital detector is now widely used. A type of detector can be divided into an indirect conversion method and a direct conversion method.

In the indirect conversion method, X-rays are converted into visible rays, which are converted into electrical signals using a scintillator. In contrast, in the direct conversion method, X-rays are directly converted into an electrical signal using a photoconductive layer. Such a direct conversion method is characterized in that it is suitable for a high resolution system because a separate scintillator does not need to be formed and a light spreading phenomenon is not occurred.

The photoconductive layer used in the direct conversion method is formed by depositing a polycrystalline semiconductor material, such as CdTe, on a surface of a CMOS substrate using a method, such as vacuum thermal deposition.

Meanwhile, a lower electrode and an upper electrode are formed under and over the photoconductive layer, respectively. Charges generated by the photoconductive layer while X-rays are radiated are collected by the lower electrode. To this end, a bias voltage is applied to the upper electrode.

However, even after the radiation of the X-rays is terminated, electrons and holes trapped in the photoconductive layer during the radiation of the X-rays are detrapped, thereby generating a lag signal. In order to reduce such a lag signal, a method for reducing a trap in the photoconductive layer may be suggested, but it is impossible to reduce the trap to a specific level or less due to the nature of the polycrystalline semiconductor formed by vacuum thermal deposition.

Meanwhile, as another method, there may be suggested a method that detrapped charges can be under recombination process by applying a reverse bias voltage to the upper electrode after the radiation of the X-rays. In this case, however, a high voltage needs to be applied in a fast frequency. This has a technical limit. Furthermore, a Schottky diode between the lower electrode and the photoconductive layer and the CMOS substrate may be greatly damaged. Accordingly, the corresponding method cannot be applied.

DETAILED DESCRIPTION OF THE INVENTION

Technical Problem

An object of the present invention is to effectively improve an image lag phenomenon in a direct conversion type detector.

Technical Solution

In order to achieve the above object, the present invention provides an X-ray detector, including a lower electrode formed over a substrate and applied with a first driving voltage V1; an auxiliary electrode formed in the periphery of the lower electrode and applied with a second driving voltage V2; a photoconductive layer formed over the lower electrode and the auxiliary electrode; and an upper electrode formed over the photoconductive layer and applied with a third driving voltage V3. The third driving voltage V3 right after the radiation of the X-rays is off is a reverse bias voltage.

In this case, the first to the third driving voltages may be indicative of a relation of V2<V3<V1 in the X-ray radiation-on time interval, and the first to the third driving voltages may be indicative of a relation of V2<V1<V3 in at least part of the X-ray radiation-off time interval. The third driving voltage V3 of the reverse bias may have a pulse form synchronized in a pulse form simultaneously at the time of the X-ray radiation-off. The X-ray detector may further include a passivation film having a pad hole which is interposed between the lower electrode and the auxiliary electrode and exposes the lower electrode. The auxiliary electrode may be placed in the periphery of the pad hole. The photoconductive layer may be made of at least one of CdTe, CdZnTe, PbO, $PbI_2$, $HgI_2$, GaAs, Se, TlBr, and $BiI_3$.

In another aspect, the present invention provides an X-ray imaging device, including an X-ray detector including a lower electrode formed over a substrate, an auxiliary electrode formed in the periphery of the lower electrode, a photoconductive layer formed over the lower electrode and the auxiliary electrode, and an upper electrode formed over the photoconductive layer, an X-ray radiation device radiating X-rays to the X-ray detector, and a power supply unit applying first, second, and third driving voltages V1, V2, and V3 to the lower electrode, the upper electrode, and the auxiliary electrode, respectively while the third driving voltage V3 right after the radiation of the X-rays is off is a reverse bias voltage.

In this case, the first to the third driving voltages V1, V2, and V3 may be indicative of a relation of V2<V3<V1 in the X-ray radiation-on time interval, and the first to the third driving voltages may be indicative of a relation of V2<V1<V3 in at least part of the X-ray radiation-off time interval. The third driving voltage V3 of the reverse bias may be synchronized in a pulse form simultaneously at the time of the X-ray radiation-off.

In yet another aspect, the present invention provides a method for driving an X-ray imaging device, including the steps of radiating X-rays to an X-ray detector including a lower electrode formed over a substrate, an auxiliary electrode formed in the periphery of the lower electrode, a photoconductive layer formed over the lower electrode and the auxiliary electrode, and an upper electrode formed over the photoconductive layer during an X-ray radiation-on time interval and applying a reverse bias voltage to the auxiliary electrode in an X-ray radiation-off time interval.

In this case, first to third driving voltages having a relation of V2<V3<V1 may be applied to the lower electrode, the auxiliary electrode, and the upper electrode, respectively, in the X-ray radiation-on time interval. The first to the third driving voltages having a relation of V2<V1<V3 may be applied to the lower electrode, the auxiliary electrode, and the upper electrode, respectively, in at least part of the X-ray radiation-off time interval. The reverse bias voltage may be synchronized in a pulse form simultaneously at the time of the X-ray radiation-off.

In yet another aspect, the present invention provides an X-ray detector, including a first electrode, a photoconductive layer which receives X-rays and generates charges; a second electrode which faces at least part of the first electrode with the photoconductive layer interposed between the second electrode and the first electrode and which is applied with a voltage so that the charges are collected by the first electrode; and a third electrode which comes in contact with at least part of the photoconductive layer. A electrical potential of the third electrode is determined between a electrical potential of the first electrode and a electrical potential of the second electrode during the X-rays radiation process. A electrical potential of the third electrode right after the radiation of the X-rays is off is applied so that a electrical potential between the second electrode and the third electrode is higher than a electrical potential between the first electrode and the third electrode.

In this case, the first electrode, the second electrode, and the third electrode may be formed in different layers. The third electrode may be placed between the first electrode and the second electrode. During the X-rays radiation process or after the radiation of the X-rays is off, voltages applied to the first electrode and the second electrode may have no change.

Advantageous Effects

In accordance with the present invention, the auxiliary electrode is configured to be in the periphery of the lower electrode under the photoconductive layer, the bias voltage between the voltages of the lower electrode and the upper electrode is applied to the auxiliary electrode during the X-ray radiation time interval, and the reverse bias voltage which is higher than the voltage of the lower electrode is applied to the auxiliary electrode right after the X-rays are radiated. Accordingly, charge collection efficiency in the lower electrode can be significantly increased, and an image lag phenomenon by detrapped charges can be improved.

BEST MODE FOR CARRYING OUT THE INVENTION

Hereinafter, embodiments of the present invention are described in detail with reference to the accompanying drawings.

Figure 1:
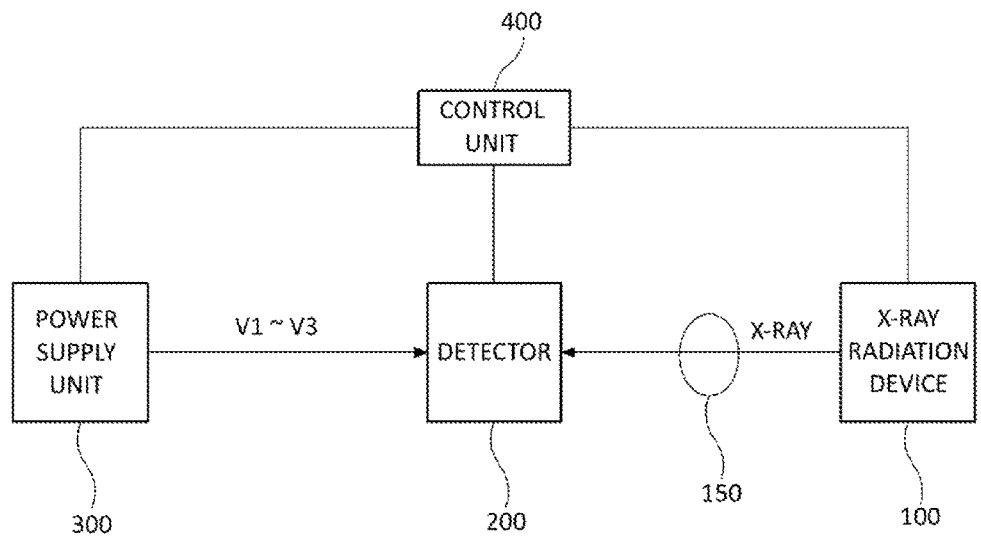
FIG. 1 is a block diagram schematically showing an X-ray imaging device in accordance with an embodiment of the present invention.
Figure 2:
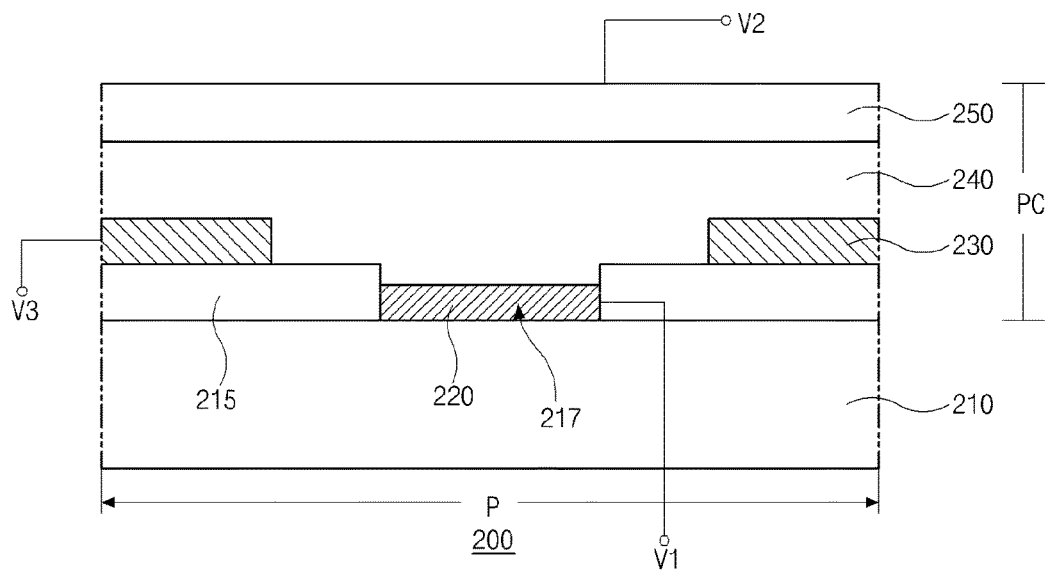
FIG. 2 is a cross-sectional view schematically showing the detector of the X-ray imaging device in accordance with an embodiment of the present invention.

FIG. 1 is a block diagram schematically showing an X-ray imaging device in accordance with an embodiment of the present invention, and FIG. 2 is a cross-sectional view schematically showing the detector of the X-ray imaging device in accordance with an embodiment of the present invention.

Referring to FIG. 1, the X-ray imaging device 10 in accordance with an embodiment of the present invention may include an X-ray radiation device 100, a detector 200, a power supply unit 300, and a control unit 400.

The X-ray radiation device 100 is an element for generating and radiating X-rays. The X-rays are incident on the detector 200 through a test object 150.

The detector 200 uses a direct method for directly converting incident X-rays into an electrical signal. Pixel regions, that is, a basic unit for X-ray detection, may be disposed in a matrix form in the detector 200.

The power supply unit 300 is an element for generating driving voltages for driving the detector 200. In particular, the power supply unit 300 generates first to third driving voltages V1 to V3 and applies them to the detector 200.

Meanwhile, the power supply unit 300 may be implemented in such a way as to be embedded in the detector 200. Furthermore, the power supply unit 300 may generate a driving voltage for driving the X-ray radiation device 100, if necessary. Alternatively, the power supply unit 300 may include an additional power supply unit for generating the driving voltage of the X-ray radiation device 100.

The control unit 400 is an element for controlling the operations of the elements constructing the X-ray imaging device 10. In particular, the control unit 400 may generate a control signal for controlling output timing of at least one of the driving voltages V1 to V3 output by the power supply unit 300 based on timing at which the X-ray radiation device 100 radiates X-rays. The control unit 400 may transmit the control signal to the detector 200 or the power supply unit 300 using a wireless communication method.

The configuration of the detector is described in more detail below with reference to FIG. 2.

Referring to FIG. 2, a photoelectric conversion element PC for converting X-rays into an electrical signal may be formed on a substrate 210 in each of the pixel regions P of the detector 200 in accordance with an embodiment of the present invention.

In this case, for example, a CMOS substrate, a glass substrate, a graphite substrate, or a substrate in which ITO has been stacked on an aluminum oxide ($Al_2O_3$) base may be used as the substrate 210 used in the detector 200, but the present invention is not limited thereto. In an embodiment of the present invention, an example in which a CMOS substrate is used as the substrate 210 is described, for convenience of description.

A passivation film 215 is formed on a surface of the substrate 210. The passivation film 215 may be made of silicon oxide ($SiO_2$) or silicon nitride (SiNx), that is, an inorganic insulating material, for example.

A pad hole 217 may be formed in the passivation film 215 for each pixel region P. A lower electrode 220 may be formed in the pad hole 217. The lower electrode 220 may constitute the photoelectric conversion element PC, for example, it corresponds to a first electrode 220.

The lower electrode 220 may be made of a material to form a Schottky junction with a photoconductive layer 240 on the upper side. For example, aluminum (Al) may be used as the material, but the present invention is not limited thereto. The first driving voltage V1 from the power supply unit 300 is applied to the lower electrode 220.

In this case, in an embodiment of the present invention, an example in which electrons having higher mobility than positive holes are collected through the lower electrode 220 is described. In this case, when X-rays are radiated, the first driving voltage V1 applied to the lower electrode 220 has a higher level than the second driving voltage V2 which is a bias voltage applied to the upper electrode 250. Meanwhile, in an embodiment of the present invention, a case that a ground voltage is applied as the first driving voltage V1 is described, for a convenience of description.

An auxiliary electrode 230 is formed over the substrate 210 on which the lower electrode 220 has been formed. The auxiliary electrode 230 is configured to be spaced apart from the lower electrode 220 in such a way as to be electrically disconnected from the lower electrode 220. In this case, the auxiliary electrode 230 may be configured to be at a position higher than the lower electrode 220 and lower than the upper electrode 240. That is, in each pixel region P, the auxiliary electrode 230 may be spaced apart from the edge of the lower electrode 220 and formed in at least part of an upper layer in the periphery of the lower electrode 220. In accordance with an embodiment of the present invention, the auxiliary electrode 230 may be configured to be spaced apart from the pad hole 217 and to be formed on at least part of the passivation film 215 in the periphery of the pad hole 217.

The auxiliary electrode 230 is an electrode constituting the photoelectric conversion element PC for the embodiment of the present invention, for example, it corresponds to a third electrode 230. The auxiliary electrode 230 may be made of a material forming an ohmic contact with the photoconductive layer 240 on the upper side. For example, gold (Au) may be used as the material, but the present invention is not limited thereto. The third driving voltage V3 from the power supply unit 300 is applied to the auxiliary electrode 230.

The photoconductive layer 240 may be formed over the substrate 210 on which the auxiliary electrode 230 has been formed, for each pixel region P.

The photoconductive layer 240 generates electron-positive-hole pairs when X-rays are incident thereon. A material of an excellent charge mobility, a high absorption coefficient, a low dark current, and a low level energy for generating electron-positive-hole pair may be used as the photoconductive layer 240. For example, at least one of photoconductive material groups, such as CdTe, CdZnTe, PbO, $PbI_2$, $HgI_2$, GaAs, Se, TlBr, and $BiI_3$, may be used as the material.

An upper electrode 250 is formed over the substrate 210 over which the photoconductive layer 240 has been formed. The upper electrode 250 is an electrode constituting the photoelectric conversion element PC, for example, corresponds to a second electrode 250.

The upper electrode 250 may be made of a material forming an ohmic contact with the photoconductive layer 240. Accordingly, the upper electrode 250 may be made of the same material as the auxiliary electrode 230 which forms an ohmic contact with the photoconductive layer 240. For example, gold (Au) may be used as the material, but the present invention is not limited thereto.

The second driving voltage V2 from the power supply unit 300 is applied to the upper electrode 250. For example, a negative polarity voltage, that is, a voltage lower than the first driving voltage V1, may be applied as the second driving voltage V2. Accordingly, electrons generated by the photoconductive layer 240 may flow into the lower electrode 220.

Meanwhile, in the detector 200 configured as described above, the auxiliary electrode 230 is formed in the periphery of the lower electrode 220 under the photoconductive layer 240. The third driving voltage V3 is applied to the auxiliary electrode 230, thereby being capable of improving an image lag phenomenon and also further improving charge collection efficiency. This is described in more detail below with reference to FIGS. 3 to 5.

Figure 3:
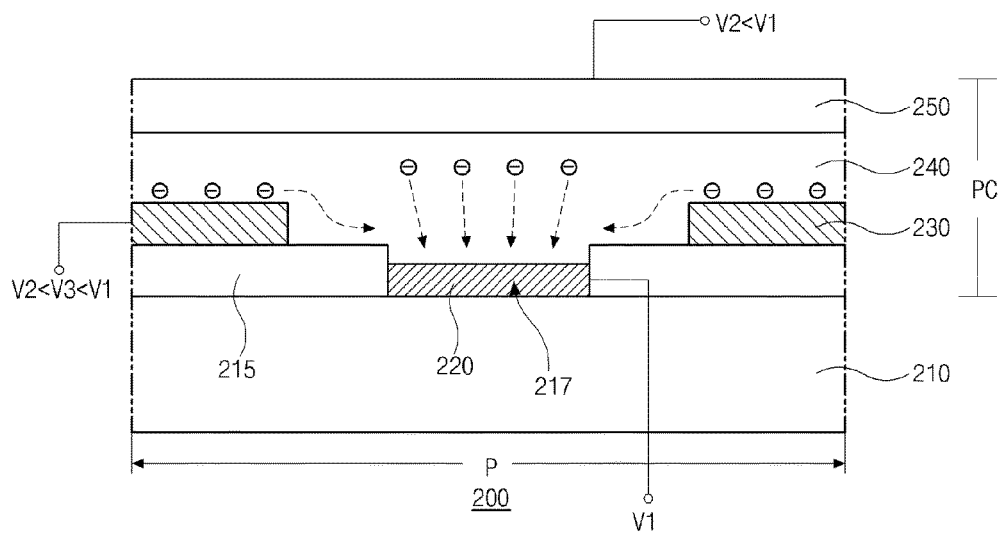
FIGS. 3 and 4 are diagrams schematically showing the state of the detector in an X-ray radiation-on time interval and an X-ray radiation-off time interval after X-rays are radiated in accordance with an embodiment of the present invention.
Figure 4:
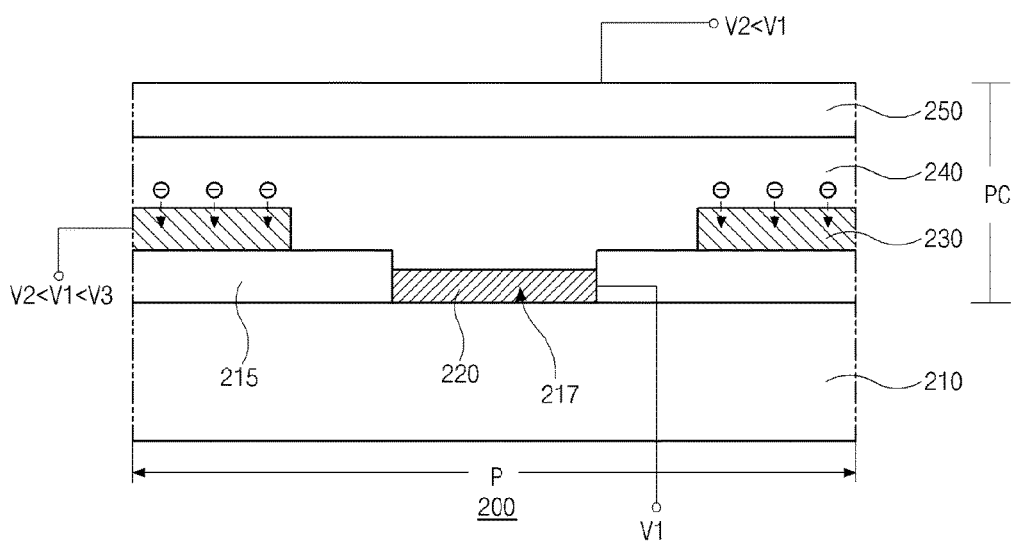
Figure 5:
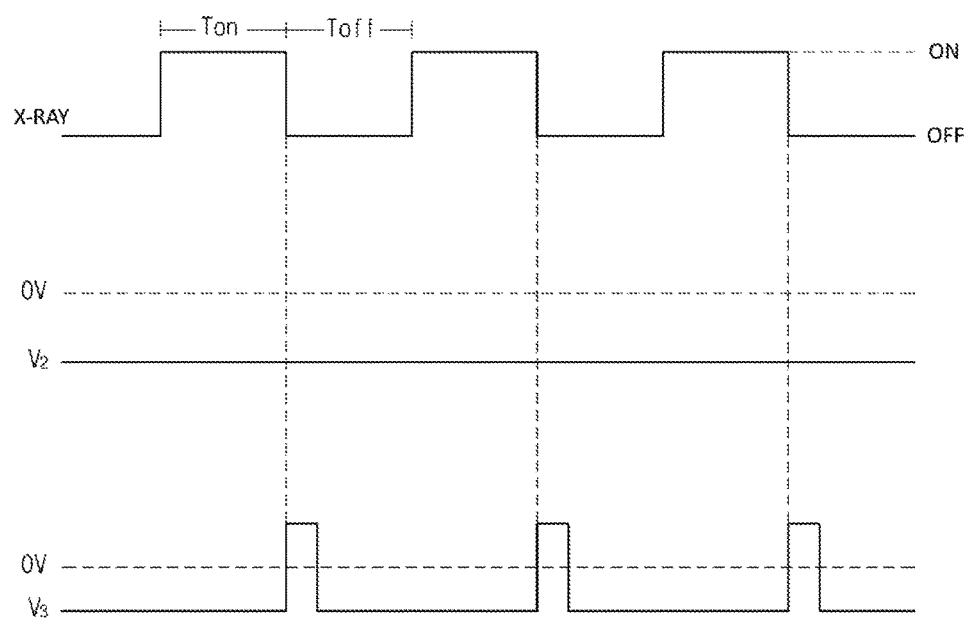
FIG. 5 is a diagram schematically showing the waveforms of second and third driving voltages in the X-ray radiation-on/radiation-off time intervals in accordance with an embodiment of the present invention.

FIGS. 3 and 4 are diagrams schematically showing the state of the detector in an X-ray radiation-on time interval and an X-ray radiation-off time interval after X-rays are radiated in accordance with an embodiment of the present invention, and FIG. 5 is a diagram schematically showing the waveforms of second and third driving voltages in the X-ray radiation-on/radiation-off time intervals in accordance with an embodiment of the present invention.

First, referring to FIGS. 3 and 5, in the section in which the X-ray radiation device 100 radiates X-rays, that is, during an X-ray radiation-on time interval Ton, the second driving voltage V2 which has a negative polarity and a bias voltage having a lower level than the first driving voltage V1, is applied to the upper electrode 250.

Accordingly, electrons generated when the X-rays are radiated may flow into and may be collected by the lower electrode 220.

Meanwhile, the third driving voltage V3 is applied to the auxiliary electrode 230. The third driving voltage V3 is preferably applied as a bias voltage having a lower level than the first driving voltage V1 and a higher level than the second driving voltage V2 (i.e., V2<V3<V1).

When the third driving voltage V3 having such a level is applied, a movement of electrons which are toward the lower electrode 220 and generated by the photoconductive layer 240 when X-rays are radiated, can be improved. Accordingly, the collection of charges by the lower electrode 220 can be significantly increased, and the number of electrons trapped in the photoconductive layer 240 can be reduced.

When the auxiliary electrode 230 becomes a floating state in which a voltage has not been applied, electrons accumulated on the auxiliary electrode 230 of the floating state cannot be controlled. Furthermore, when the auxiliary electrode 230 becomes a ground state, electrons flow into the auxiliary electrode 230 in addition to the lower electrode 220 so that charge collection efficiency is deteriorated. Furthermore, when the third driving voltage V3 applied to the auxiliary electrode 230 becomes lower than the second driving voltage V2 applied to the upper electrode 250, a movement of electrons is hindered.

From this point of view, when X-rays are radiated, the third driving voltage V3 applied to the auxiliary electrode 230 preferably has the relation of V2<V3<V1.

Next, referring to FIGS. 4 and 5, in the section in which X-rays are not radiated after the X-ray radiation-on time interval Ton is terminated, that is, during an X-ray radiation-off time interval Toff, the same voltages as those in the X-ray radiation-on time interval Ton may be applied as the first and the second driving voltages V1 and V2. As described above, the first and the second driving voltages V1 and V2 may have a DC form in which a specific voltage level is maintained during the X-ray radiation-on and radiation-off time intervals Ton and Toff.

Meanwhile, a reverse bias voltage having a higher level than the first driving voltage V1 is preferably applied as the third driving voltage V3 applied to the auxiliary electrode 230 (i.e., V3>V1). In particular, the third driving voltage V3 of the reverse bias is preferably applied in a pulse form in synchronization with the start of the X-ray radiation-off time interval Toff, but the present invention is not limited thereto. In this case, the voltage of a pulse form may be applied for a short time of several microseconds, for example.

When the third driving voltage V3 of the reverse bias is applied as described above, an electrical potential V3−V2 between the upper electrode 250 and the auxiliary electrode 230 becomes greater than a electrical potential V1−V2 between the upper electrode 250 and the lower electrode 220. Accordingly, detrapped electrons in the X-ray radiation-off state are not collected by the lower electrode 220, and trapped charges can be under recombination process.

Accordingly, an image lag phenomenon by detrapped charges can be effectively improved.

As described above, in accordance with an embodiment of the present invention, the auxiliary electrode is configured in the periphery of the lower electrode under the photoconductive layer, the bias voltage between the voltages of the lower electrode and the upper electrode is applied to the auxiliary electrode during the section in which X-rays are radiated, and the reverse bias voltage higher than the voltage of the lower electrode is applied right after the X-rays are radiated. Accordingly, charge collection efficiency in the lower electrode can be significantly increased, and an image lag phenomenon attributable to detrapped charges can be improved.

The invention claimed is:

1. An X-ray detector, comprising:
a lower electrode formed over a substrate and applied with a first driving voltage V1;
an auxiliary electrode formed in a periphery of the lower electrode and applied with a third driving voltage V3;
a photoconductive layer formed over the lower electrode and the auxiliary electrode; and
an upper electrode formed over the photoconductive layer and applied with a second driving voltage V2,
wherein the third driving voltage V3 right after the radiation of the X-rays is off is a reverse bias voltage.

2. The X-ray detector of claim 1,
wherein the first to the third driving voltages are indicative of a relation of V2<V3<V1 in the X-ray radiation-on time interval, and
wherein the first to the third driving voltages are indicative of a relation of V2<V1<V3 in at least part of the X-ray radiation-off time interval.

3. The X-ray detector of claim 1, wherein the third driving voltage V3 of the reverse bias has a pulse form synchronized in a pulse form simultaneously with the X-ray radiation-off.

4. The X-ray detector of claim 1, further comprising a passivation film having a pad hole which is interposed between the lower electrode and the auxiliary electrode and exposes the lower electrode, wherein the auxiliary electrode is placed in a periphery of the pad hole.

5. The X-ray detector of claim 1, wherein the photoconductive layer is made of at least one of CdTe, CdZnTe, PbO, $PbI_2$, $HgI_2$, GaAs, Se, TlBr, and $BiI_3$.

6. An X-ray imaging device, comprising:
an X-ray detector comprising a lower electrode formed over a substrate, an auxiliary electrode formed in a periphery of the lower electrode, a photoconductive layer formed over the lower electrode and the auxiliary electrode, and an upper electrode formed over the photoconductive layer;
an X-ray radiation device radiating X-rays to the X-ray detector; and
a power supply unit applying first, second, and third driving voltages V1, V2, and V3 to the lower electrode, the upper electrode, and the auxiliary electrode, respectively,
wherein the third driving voltage V3 right after the radiation of the X-rays is off is a reverse bias voltage.

7. The X-ray imaging device of claim 6,
wherein the first to the third driving voltages V1, V2, and V3 are indicative of a relation of V2<V3<V1 in the X-ray radiation-on time interval, and
wherein the first to the third driving voltages are indicative of a relation of V2<V1<V3 in at least part of the X-ray radiation-off time interval.

8. The X-ray imaging device of claim 6, wherein the third driving voltage V3 of the reverse bias is synchronized in a pulse form simultaneously with the X-ray radiation-off.

9. An X-ray detector, comprising:
a first electrode;
a photoconductive layer receiving X-rays and generating charges;
a second electrode facing at least part of the first electrode, interposing the photoconductive layer between the second electrode and the first electrode, and applied with a voltage to collect the charges by the first electrode; and
a third electrode contacting with at least part of the photoconductive layer,
wherein an electrical potential of the third electrode is determined between an electrical potential of the first electrode and an electrical potential of the second electrode during an X-ray radiation is on, and
wherein the electrical potential of the third electrode is applied to become an electrical potential between the second electrode and the third electrode is higher than an electrical potential between the first electrode and the third electrode right after the X-ray radiation is off.

10. The X-ray detector of claim 9,
wherein the first electrode, the second electrode, and the third electrode are formed in different layers, and
wherein the third electrode is placed between the first electrode and the second electrode.

11. The X-ray detector of claim 9, wherein during the X-ray radiation is on or right after the X-ray radiation is off, voltages applied to the first electrode and the second electrode have no change.

* * * * *